US008624630B2

(12) United States Patent
Liao et al.

(10) Patent No.: US 8,624,630 B2
(45) Date of Patent: Jan. 7, 2014

(54) CLOCK AND DATA RECOVERY SYSTEM, PHASE ADJUSTING METHOD, AND PHASEDETECTOR

(75) Inventors: Jiansheng Liao, Shenzhen (CN); Shanyong Cao, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 0 days.

(21) Appl. No.: 13/575,595

(22) PCT Filed: Apr. 18, 2011

(86) PCT No.: PCT/CN2011/072954
§ 371 (c)(1),
(2), (4) Date: Jul. 26, 2012

(87) PCT Pub. No.: WO2012/013051
PCT Pub. Date: Feb. 2, 2012

(65) Prior Publication Data
US 2012/0293226 A1    Nov. 22, 2012

(30) Foreign Application Priority Data

Jul. 26, 2010    (CN) .......................... 2010 1 0245170

(51) Int. Cl.
*H03D 13/00*    (2006.01)
(52) U.S. Cl.
USPC ................................................ 327/3; 327/12

(58) Field of Classification Search
USPC ................. 327/2, 3, 7, 12, 39, 40, 42, 47, 49; 375/375

See application file for complete search history.

(56) References Cited

U.S. PATENT DOCUMENTS

| 5,799,048 | A | 8/1998 | Farjad-Rad et al. |
| 6,509,801 | B1 | 1/2003 | Lao et al. |
| 6,538,475 | B1 * | 3/2003 | Johansen et al. ................. 327/12 |
| 7,409,027 | B1 | 8/2008 | Sudjian |
| 7,622,959 | B2 * | 11/2009 | Yamanaka ......................... 327/3 |
| 2002/0021470 | A1 | 2/2002 | Savoj |

OTHER PUBLICATIONS

International Search Report for PCT/CN2011/072954, Jul. 14, 2011.

* cited by examiner

*Primary Examiner* — Hai L Nguyen
(74) *Attorney, Agent, or Firm* — Foley & Lardner LLP

(57) ABSTRACT

Disclosed is a phase discriminator, including: a first XOR gate connected to a trigger and a delay unit, a second XOR gate connected to the trigger and a latch, wherein the first XOR gate is a current mode logic XOR gate, the first XOR gate comprises a first offset current source circuit outputting a first adjustable offset circuit for controlling amplitude of the error signal output by the first XOR gate; and/or, the second XOR gate is a current mode logic XOR gate, the second XOR gate comprises a second offset current source circuit outputting a second adjustable offset circuit for controlling amplitude of reference signal output by the second XOR gate. Also disclosed are a clock and data recovery system and a phase adjustment method. The present invention can prevent introducing noise coupling to the voltage control oscillator (VCO) module.

15 Claims, 8 Drawing Sheets

CLOCK AND DATA RECOVERY SYSTEM, PHASE ADJUSTING METHOD, AND PHASEDETECTOR

TECHNICAL FIELD

The present invention relates to a clock and data recovery system, and particularly, to a clock and data recovery system, a phase adjusting method and a phase discriminator.

BACKGROUND OF THE RELATED ART

The clock and data recovery system is widely applied in fields such as magnetic disk storage, wireless communication, and optical network communication, etc. FIG. 1 is a structural block diagram of a typical clock and data recovery system, including a phase discriminator 102, a frequency discriminator 104, a charge pump (optional) & filter 103, a voltage control oscillator (VCO) 105, a frequency divider 106, and a data recovery retimer 101.

The frequency discriminator 104 compares the clock signal outputted by the frequency divider 106 with the reference clock, the generated error signal generates a control voltage through the charge pump (optional) & filter 103 to enable the frequency of VCO 105 to oscillate around the preset working frequency range. Then the phase discriminator 102 compares the phase relationship of the input data and the VOC feedback clock, and when the input data and the phase of the feedback clock are locked, the data recovery retimer 101 restores the data so as to eliminate the jitter and distortion generated during data transmission. Under ideal situation, the effective edge of the clock shall be sampled in the middle of the data so as to achieve the best anti-noise ability, however, during the actual circuit implementation, due to non-ideal situations such as the upper and lower current sources of the charge pump do not match each other, various module devices of the loop mismatch, process errors, etc., the effective edge of the clock usually is not sampled in the middle of the data when the loop is locked. When the loop is locked, the clock and the data have a fixed phase difference which increases the bit error rate. The generation of such phase difference can be equivalent to the situation that there is an offset current source $I_{offset}$ inside the charge pump (optional) & filter 103, as shown in FIG. 1. With the change of the error signal and reference signal of the phase discriminator 102, this offset current source equivalently charges (or discharges) the filter, causing the control voltage of the VCO to increase (or decrease) and then the clock generated by the VCO deviates from the best sampling point.

In order to realize best sampling, usually a phase adjustment function needs to be added into the loop so as to adjust the phase of the clock or data being locked to achieve minimum bit error rate. Since the frequency of the clock is very high, usually phase adjustment is carried out in the data path, in which a common implementation method is to realize phase adjustment inside the phase discriminator, as shown in FIG. 2. FIG. 2 is a block diagram of a typical phase discriminator with Hogge structure and phase adjustment function. The data are outputted as Q1 after being triggered by the down edge of a D trigger 201, and at the same time, data after being delayed (DATA_D) is obtained after going through a delay unit D1 203 and a phase adjustment unit 204, two paths of signals of Q1 and DATA_D are fed into an XOR gate 205 to generate an error signal (ERROR) representing the phase relationship between the clock and data, in addition, Q1 signal is delayed by half of a clock period through a latch 202 to obtain a signal Q2, and Q1 and Q2 signals are fed into the XOR gate 206 to generate a reference signal (REFERENCE) related to data flip, and the error signal and reference signal are fed into the charge pump (optional) & filter 103 to obtain the control voltage of the VCO so as to control the clock phase outputted by the VCO. The phase adjustment unit 204 can directly delay the effective flip edge of the data so as to adjust the pulse width of the ERROR signal and thus achieving the phase adjustment of the output clock of the VCO.

Another phase adjustment method is proposed in U.S. patent Ser. No. 10/159,788. Since the fixed phase difference when being locked can be equivalent to the situation that there is an offset current source $I_{offset}$ in a filter 108 in FIG. 3, the concept of this patent is to insert at the filter a switch current source array controlled by phase adjustment (PHASE_ADJUST) [1:0] and PHASE_ADJUST [3:2] so as to counter the equivalent offset current source $I_{offset}$. FIG. 3 is a modular block diagram of this patent, in which the wires of the frequency discrimination portion is ignored. In this patent, a current source array 300 and a current source array 350 are added at the VCO control voltage, i.e. at the filter 108, the equivalent offset current source $I_{offset}$ is countered by the current generated by the current source array 300 and/or current source array 350 by way of the selection of PHASE_ADJUST [1:0] and PHASE_ADJUST [3:2] so as to achieve best sampling. A defect of this patent lies in that: the switch array controlled by PHASE_ADJUST [1:0] and PHASE_ADJUST [3:2] is directly connected to the VCO control lines, and the noise generated by the switch and/or introduced externally is easily to be coupled into the key modules of the VCO via a parasitic capacitor or substrate, which makes the output clock phase of the VCO jitter. Another defect of this patent lies in that: the phase adjustment is discontinuous and depends upon how many switch arrays are used, on the one hand it makes the actual best sampling not easy to be realized, and on the other hand, more pin resources will be occupied if the precision requirement on phase adjustment is higher.

SUMMARY OF THE INVENTION

The technical problem to be solved by the present invention is to provide a phase adjustment method and a phase discriminator, which will not introduce noise coupling into the VCO.

In order to solve the above problem, the present invention provides a phase discriminator, comprising: a trigger, a delay unit, a latch connected to the trigger, a first XOR gate connected to the trigger and the delay unit, a second XOR gate connected to the trigger and the latch, the phase discriminator being used for receiving a data signal and a clock signal and outputting an error signal representing phase relationship between the clock signal and the data signal and a reference signal related to flip of the data signal, wherein the first XOR gate is a current mode logic XOR gate, the first XOR gate comprises a first offset current source circuit outputting a first adjustable offset current for controlling amplitude of the error signal output by the first XOR gate;

and/or, the second XOR gate is a current mode logic XOR gate, the second XOR gate comprises a second offset current source circuit outputting a second adjustable offset current for controlling amplitude of reference signal output by the second XOR gate.

In this case, the first offset current source circuit or the second offset current source circuit comprises:

a plurality of parallel connected current sources and a plurality of switch units, and each switch unit controls ON or OFF of a current source.

The phase discriminator further comprises a continuous phase adjustment unit, by which the first offset current source circuit and the second offset current source circuit are connected to each other, wherein the first offset current source circuit comprises: 1 discrete current source I10, N discrete current sources I11 to I1N, with I10 to I1N forming N+1 parallel connected branches of the first offset current source circuit;

the second offset current source circuit comprises: 1 discrete current source I20, N discrete current sources I21 to I2N, with I20 to I2N forming N+1 parallel connected branches of the second offset current source circuit, and coupled switch arrays K1 to KN, wherein Kj controls discrete current sources I1j and I2j and enables I2j to be OFF when I1j is ON and enables I2j to be ON when I1j is OFF;

the continuous phase adjustment unit is configured to: output two paths of variable currents controlled by a differential voltage, wherein one path is used as a parallel connected branch of the first offset current source circuit and another path is used as a parallel connected branch of the second offset current source circuit, with the two paths of current being equal in size and opposite in direction and controlling the first offset current and the second offset current to generate changes with equal size and opposite directions.

In this case the first XOR gate is configured to control the amplitude of the error signal by way of the following method: when the clock signal is ahead or behind the data signal by time $T_{offset}$, the first offset current outputted by the first offset current source circuit is adjusted by way of the following method so as to reduce or increase the amplitude of the error signal:

$$\Delta I_{ERR} R1 * T/2 = I_{ERR} R1 * T_{offset}$$

where $I_{ERR}$ is the first offset current before being adjusted, $\Delta I_{ERR}$ is a difference between the first offset current after being adjusted and the first offset current before being adjusted, the T is a period of the clock signal, and R1 is a load resistance of the first offset current source circuit, and the second XOR gate is configured to control the amplitude of the reference signal by way of the following method: when the clock signal is ahead or behind the data signal by time $T_{offset}$, the amplitude of the reference signal is kept unchanged, or, the first XOR gate is configured to control the amplitude of the error signal by way of the following method: when the clock signal is ahead or behind the data signal by time $T_{offset}$, the amplitude of the error signal is kept unchanged;

the second XOR gate is configured to control the amplitude of the reference signal by way of the following method: when the clock signal is ahead or behind the data signal by time $T_{offset}$, the second offset current outputted by the second offset current source circuit is adjusted by way of the following method so as to reduce or increase the amplitude of the reference signal:

$$\Delta I_{REF} R2 * T/2 = I_{ERR} R1 * T_{offset}$$

where the $\Delta I_{REF}$ is the difference between the second offset current after being adjusted and the second offset current before being adjusted, and R2 is the load resistance of the second offset current source circuit.

Wherein, the first XOR gate is configured to control the amplitude of the error signal by way of the following method: when the clock signal is ahead or behind the data signal by time $T_{offset}$, the first offset current is adjusted by way of the following method so as to reduce or increase the amplitude of the error signal:

$$2 * \Delta I_{ERR} R1 * T/2 = I_{ERR} R1 * T_{offset}$$

where the $I_{ERR}$ is the first offset current before being adjusted, the $\Delta I_{ERR}$ is the difference between the first offset current after being adjusted and the first offset current before being adjusted, the T is a period of the clock signal, and the R1 is a load resistance of the first offset current source circuit, the second XOR gate is configured to control the amplitude of the reference signal by way of the following method: when the clock signal is ahead or behind the data signal by time $T_{offset}$, the second offset current is adjusted by way of the following method so as to reduce or increase the amplitude of the reference signal, and the increased or reduced amplitude of the reference signal is equal to that of the error signal:

$$2 * \Delta I_{REF} R2 * T/2 = I_{ERR} R1 * T_{offset}$$

where the $\Delta I_{ERR}$ is the difference between the second offset current after being adjusted and the second offset current before being adjusted, and the R2 is the load resistance of the second offset current source circuit.

In this case, R1=R2.

In order to solve the above problem, the present invention also provides the clock and data recovery system, comprising a phase discriminator mentioned above.

In order to solve the above problem, the present invention also provides a phase adjustment method applied to the above clock and data recovery system, comprising:

when a clock signal leads or falls behind a data signal, adjusting a first offset current of a first XOR gate and/or a second offset current of a second XOR gate.

Wherein, the step of adjusting the first offset current of the first XOR gate and/or the second offset current of the second XOR gate comprises: when the clock signal is ahead or behind the data signal by time $T_{offset}$, amplitude of the reference signal is kept unchanged, and the first offset current is adjusted by way of the following method so as to reduce or increase the amplitude of the error signal:

$$\Delta I_{ERR} R1 * T/2 = I_{ERR} R1 * T_{offset}$$

where the $I_{ERR}$ is the first offset current before being adjusted, the $\Delta I_{ERR}$ is the difference between the first offset current after being adjusted and the first offset current before being adjusted, the T is the period of the clock signal, and the R1 is the load resistance of the first offset current source circuit;

or, the amplitude of the error signal is kept unchanged, and the second offset current is adjusted by way of the following method so as to reduce or increase the amplitude of the reference signal:

$$\Delta I_{REF} R2 * T/2 = I_{ERR} R1 * T_{offset}$$

where the $\Delta I_{REF}$ is the difference between the second offset current after being adjusted and the second offset current before being adjusted, and R2 is the load resistance of the second offset current source circuit.

Wherein, the step of adjusting the first offset current of the first XOR gate and/or the second offset current of the second XOR gate comprises: when the clock signal is ahead or behind the data signal by time $T_{offset}$, the first offset current is adjusted by way of the following method so as to reduce or increase the amplitude of the error signal:

$$2 * \Delta I_{ERR} R1 * T/2 = I_{ERR} R1 * T_{offset}$$

where the $I_{ERR}$ is the first offset current before being adjusted, the $\Delta I_{ERR}$ is the difference between the first offset current after being adjusted and the first offset current before being adjusted, the T is the period of the clock signal, and the R1 is the load resistance of the first offset current source circuit; and the second offset current is adjusted by way of the following method so as to reduce or increase the amplitude of the reference signal, and the increased or reduced amplitude of the reference signal is equal to that of the error signal:

$$2*\Delta I_{REF}R2*T/2 = I_{ERR}R1*T_{offset}$$

where the $\Delta I_{REF}$ is the difference between the second offset current after being adjusted and the second offset current before being adjusted, and the R2 is the load resistance of the second offset current source circuit.

In this case, R1=R2.

The phase adjustment method and phase discriminator proposed in the present invention can prevent introducing noise coupling into the VCO module and at the same time can realize the true best sampling.

PREFERRED EMBODIMENTS OF THE PRESENT INVENTION

In order to make the object, technical solution and advantages of the present invention more clear, the embodiments of the present invention will be further described in detail in conjunction with the accompanying drawings. It needs to note that the embodiments of the present application and the features in the embodiments can be combined with each other if there is no conflict.

The core concept of the present invention is to realize the phase adjustment function at the XOR gate of the phase discriminator. Since the phase adjustment is far away from the key modules of the VCO, it will not cause noise coupling.

Figure 1:
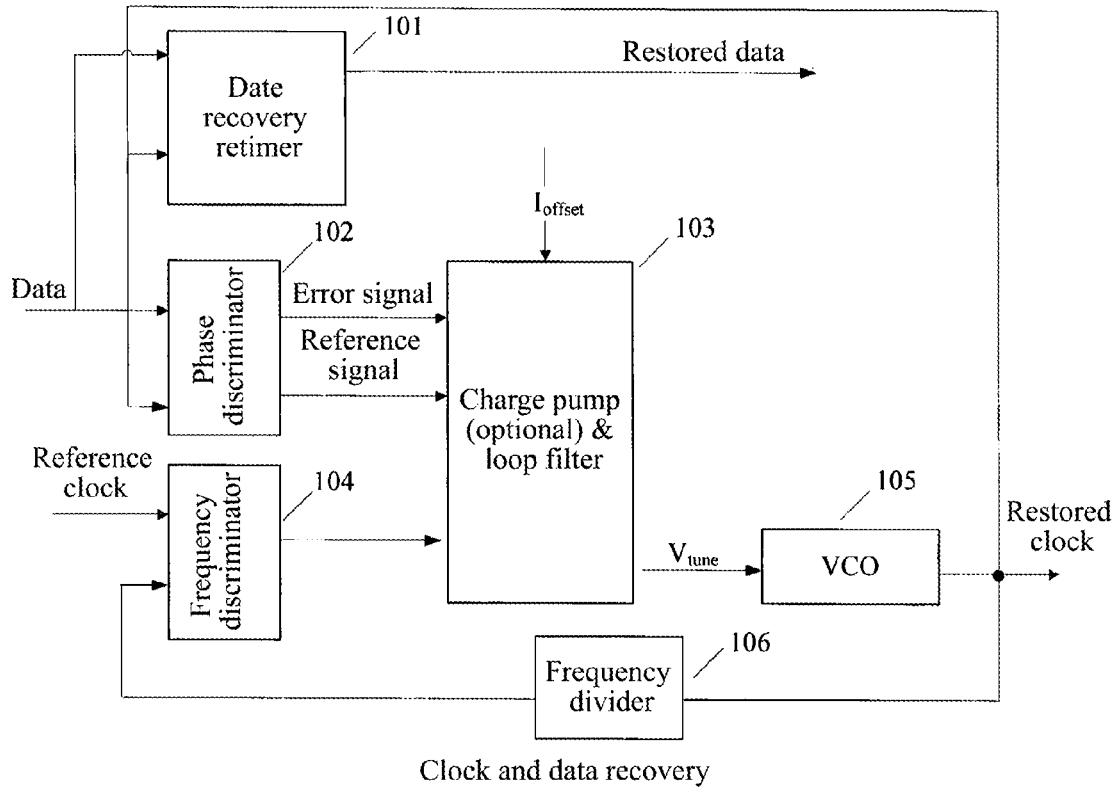
FIG. 1 is a structural block diagram of a typical clock and data recovery system.
Figure 2:
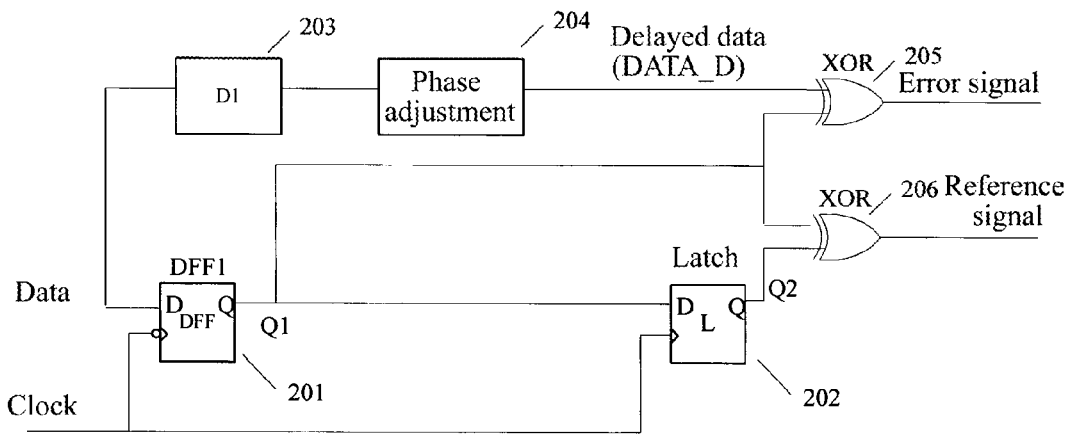
FIG. 2 is a block diagram of a typical phase discriminator with Hogge structure and phase adjustment function.
Figure 3:
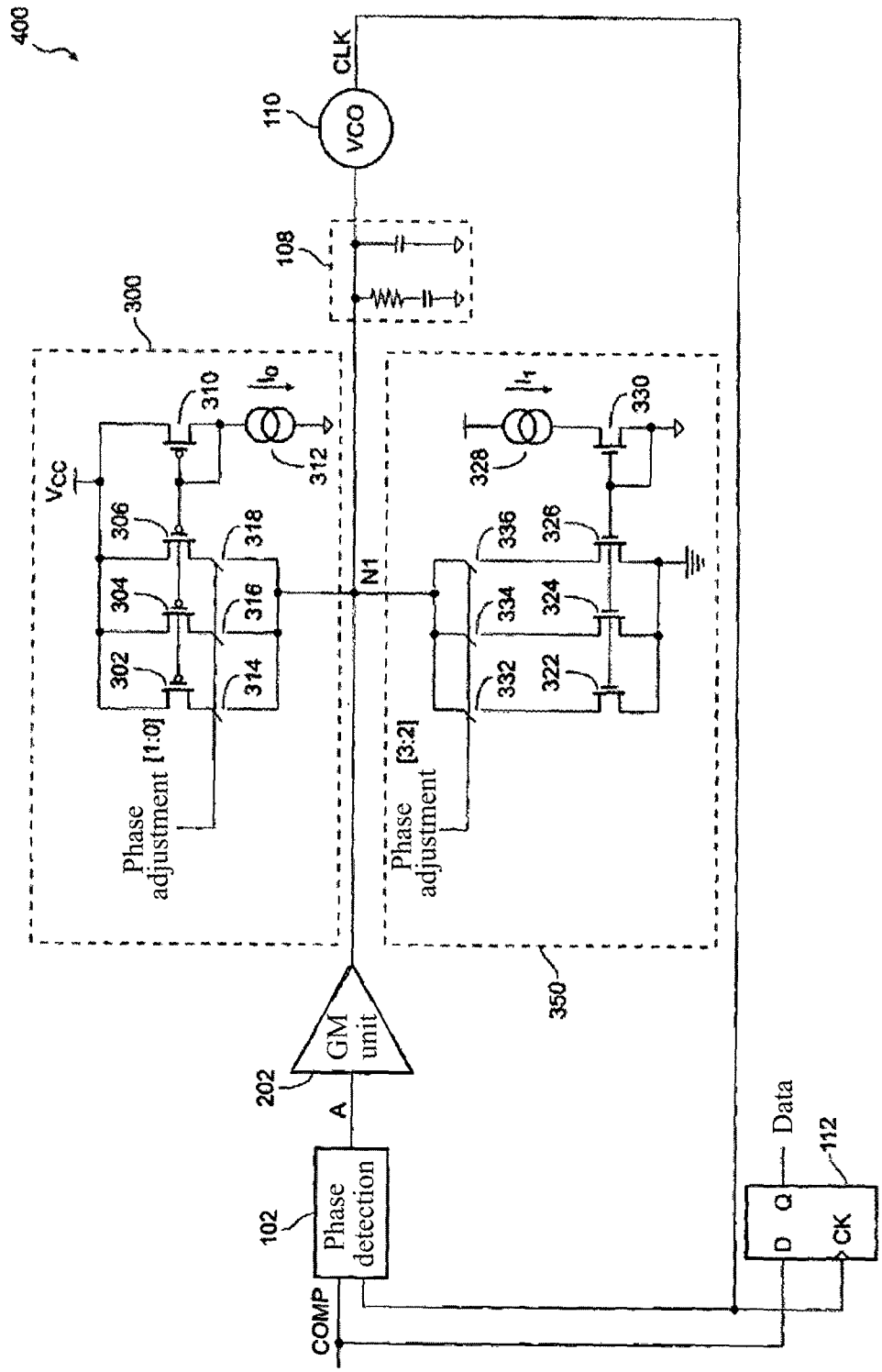
FIG. 3 is a structural block diagram of a phase adjustment method employed in the U.S. Pat. No. 7,386,085B2.
Figure 4:
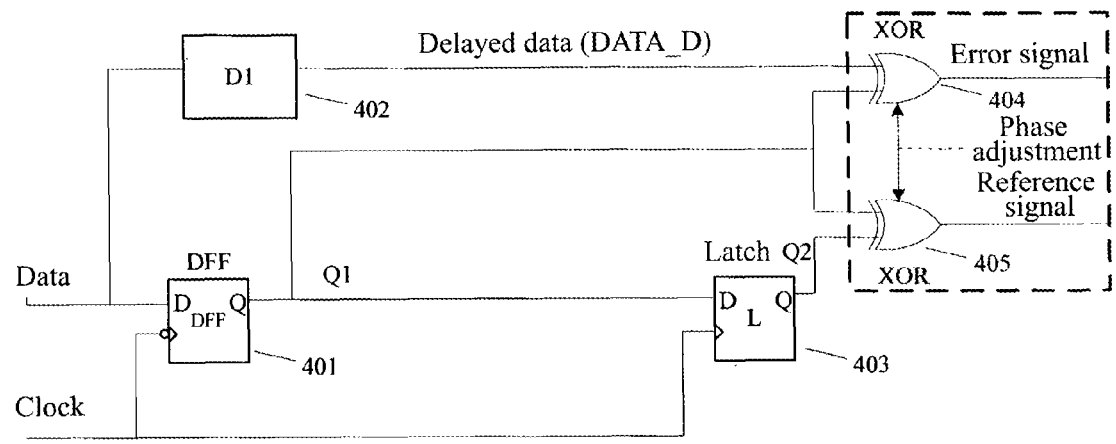
FIG. 4 is a block diagram of a phase adjustment solution proposed in the present invention, wherein the phase adjustment is realized inside an XOR gate.

The present invention provides a phase discriminator, as shown in FIG. 4. The phase adjustment function is mainly realized at two XOR gates 404 and 405 based on the Hogge phase discriminator. As shown in FIG. 4, the phase discriminator in the present invention includes: a trigger 401, a delay unit 402, a latch 403, a first XOR gate 404, and a second XOR gate 405, wherein the first XOR gate 404 and/or second XOR gate 405 are/is current mode logic XOR gate(s), wherein the data is outputted as Q1 after being triggered by the down edge of a D trigger 401, and at the same time, data after being delayed (DATA_D) is obtained after going through a delay unit 402, two paths of signals of Q1 and DATA_D are fed into an XOR gate 404 to generate an error signal (ERROR) representing the phase relationship between the clock and data, in addition, Q1 signal is delayed by half of a clock period through a latch 403 to obtain a signal Q2, and Q1 and Q2 signals are fed into the XOR gate 405 to generate a reference signal (REFERENCE) related to data flip, and the error signal and reference signal are fed into the charge pump (optional) & filter 103 to obtain the control voltage of the VCO so as to control the clock phase outputted by the VCO.

The first XOR gate 404 includes the first offset current source circuit outputting the first adjustable offset current for controlling the amplitude of the error signal outputted by the first XOR gate 404; and the second XOR gate 405 includes the second offset current source circuit outputting the second adjustable offset current for controlling the amplitude of the reference signal outputted by the second XOR gate.

In this case, both the first XOR gate 404 and the second XOR gate 405 can be current mode logic XOR gates including adjustable offset current source circuits. Also, one of the first XOR gate 404 and the second XOR gate 405 can be a current mode logic XOR gate including an adjustable offset current source circuit and another is a XOR gate including a nonadjustable offset current source circuit.

Figure 5:
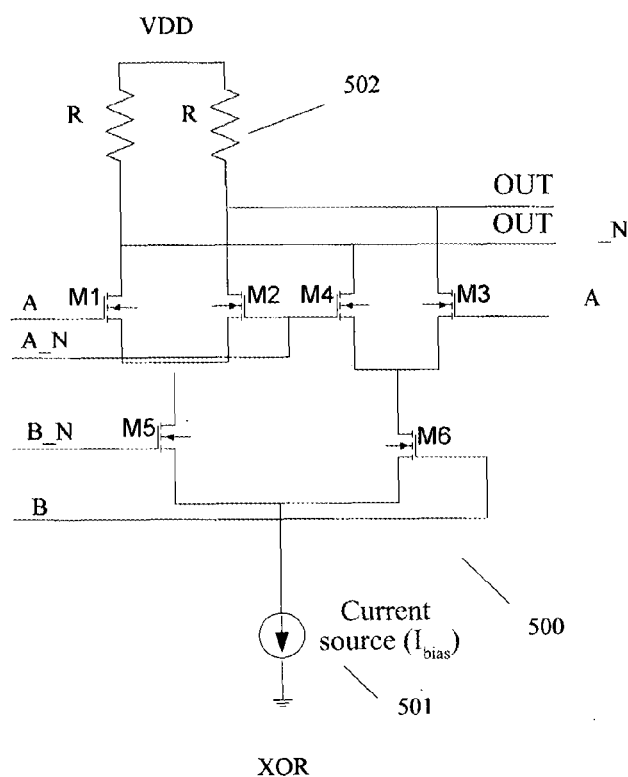
FIG. 5 is a typical current mode logic XOR gate.

The result of the current mode logic XOR gate can be made reference to FIG. 5. FIG. 5 is a current mode logic XOR gate 500, with the output thereof being the XOR operation of two input signals and the amplitude of the output signal (single end) being decided by the product of a current source $I_{bias}$ 501 and a resistor R502. Since the phase adjustment function is implemented in the phase discriminator and is far away from the VCO module, noise can be avoided being introduced into the VCO.

The working principle of the circuit shown in FIG. 5 is as follows: when the input ends A and B are high or low simultaneously, M5 and M2 or M6 and M3 conduct simultaneously so as to decrease the output end OUT, in addition, M1 and M5, M4 and M6 do not conduct simultaneously so as to increase the output end OUT_N, thus, when the inputs are the same, the output of the circuit is low. When A is different from B, for example, A is high and B is low, M5 and M1 are ON to decrease OUT_N, while since M2 and M6 are OFF, OUT is caused to be increased, thus the output is high; and when A is low and B is high, M4 and M6 are ON to decrease OUT_N, while M3 and M5 are OFF, OUT is caused to be increased, and the output is high.

Figure 6:
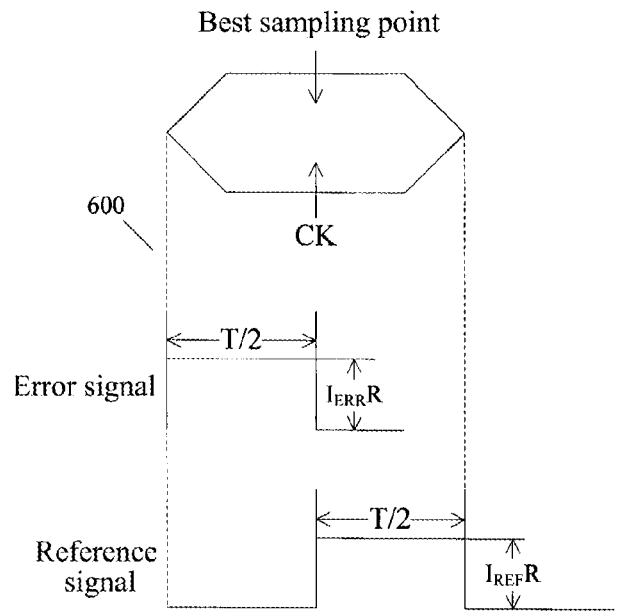
FIG. 6 is the phase relationship between the clock and the data and the output waveforms of the error signal (ERROR) and reference signal (REFERENCE) during best sampling under an ideal situation.
Figure 7:
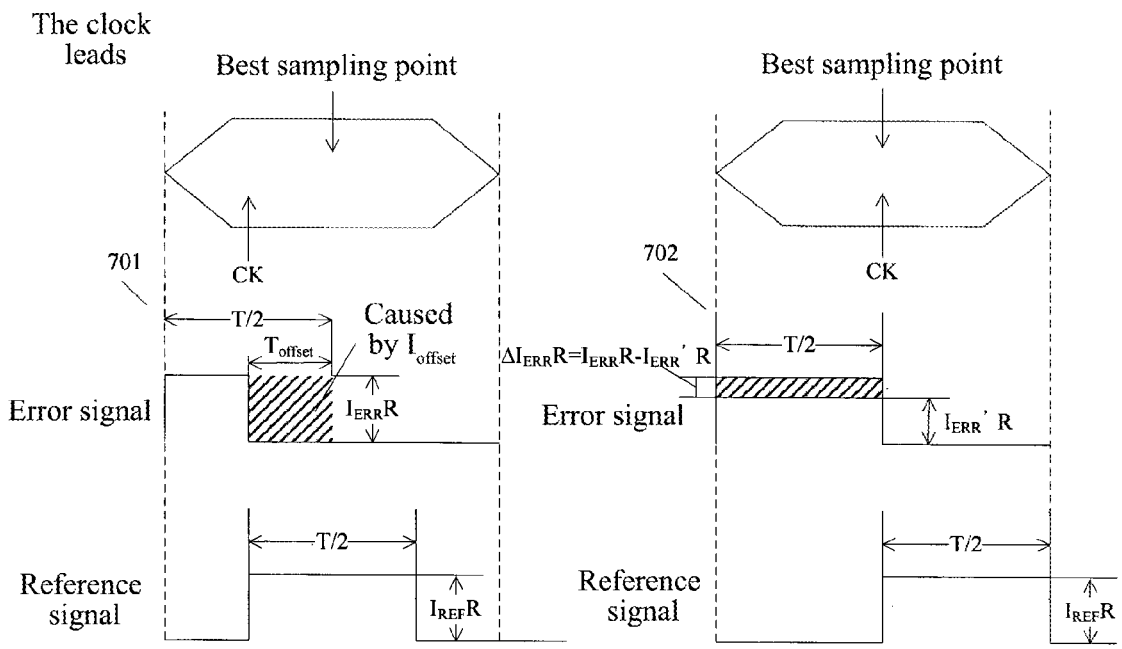
FIG. 7 is a phase adjustment method proposed in the present invention in the situation where the clock leads the data.

FIG. 6 the phase relationship between the clock and the data and the output waveforms of the error signal (ERROR) and reference signal (REFERENCE) during best sampling under an ideal situation, wherein $I_{ERR}$ and $I_{REF}$ are offset currents generated by the offset current source generating the error signal and the offset current source generating the reference signal respectively, at this moment, $I_{ERR}=I_{REF}$. Assuming that there is a fixed phase difference, as shown by 701 in FIG. 7, at this moment, the clock leads the data by time $T_{offset}$. Since the offset voltage generated by the equivalent offset current source $I_{offset}$ within a period is $I_{offset}*(T/2-T_{offset})$, the two methods proposed in the present invention counter this part of offset in the XOR gate. The first method is as shown by 702 in FIG. 7, which can decrease the amplitude of the error signal while ensuring the amplitude of the reference signal not to be changed to meet the following relation, i.e. adjust the first offset current to meet the following equation:

$$\Delta I_{ERR}R1*T/2 = I_{offset}*(T/2-T_{offset}) = I_{ERR}R1*T_{offset} = \text{CONT} \quad (1)$$

As long as the above equation is met, the best sampling condition can be met when the loop is locked. The meaning represented by the above equation is that: it can be seen according to the effects of the average voltage value that the average voltage value $I_{offset}*(T/2-T_{offset})$ generated within the phase difference $T_{offset}$ caused by $I_{offset}$ (which should be divided by the period T to obtain the actual average value, however, each item in equation (1) is divided by T, so it is equivalent to that there is no multiplication) can be equivalent to $I_{offset}*(T/2-T_{offset})$, and this part of average voltage value can also be equivalent by $\Delta I_{ERR}R*T/2$ generated by way of adjusting the amplitude of the error signal, and the above quantities shall be constant, represented as CONT, when the entire phase locked loop is locked. $\Delta I_{ERR}$ represents the value of the current after the phase adjustment of the first offset current source circuit minus the current size before the phase adjustment, i.e. the current change quantity before and after phase adjustment, wherein R1 represents the load resistance of the first offset current source circuit, $I_{ERR}$ is the first offset current before being adjusted, and T is the period of the clock signal. In addition, the amplitude of the error signal can also be kept unchanged and the amplitude of the reference signal is increased to adjust the second offset current by way of the following method:

$$\Delta I_{REF}R2*T/2 = I_{offset}*(T/2-T_{offset}) = I_{ERR}R1*T_{offset} = \text{CONT}$$

where the $\Delta I_{ERR}$ is the difference between the second offset current after being adjusted and the second offset current before being adjusted, and R2 is the load resistance of the second offset current source circuit.

Figure 8:
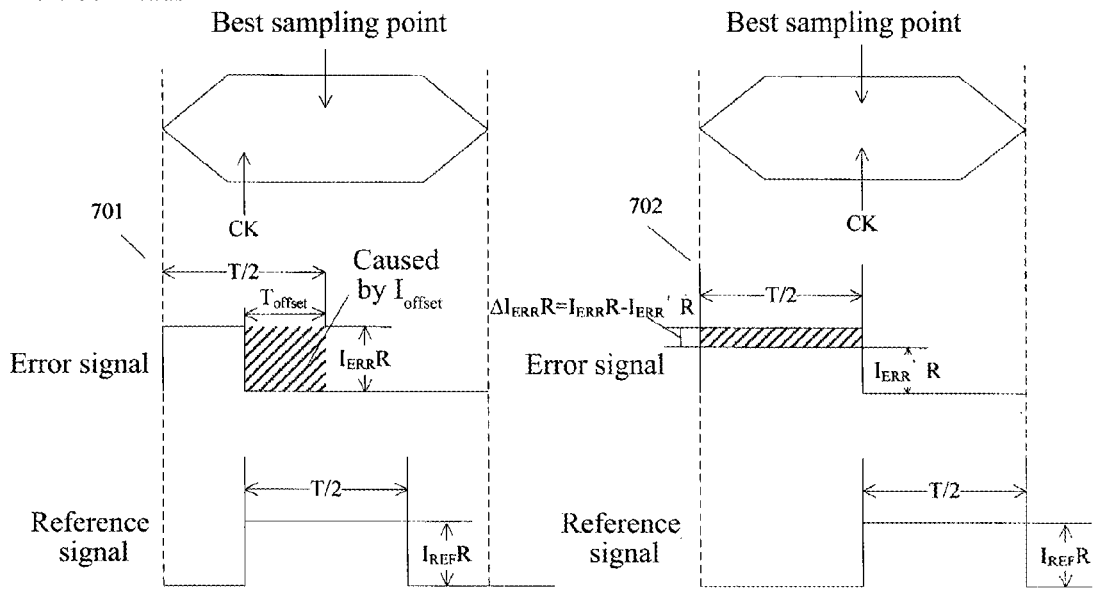
FIG. 8 is another phase adjustment method proposed in the present invention in the situation where the clock leads the data.

The second method is as shown by 802 in FIG. 8, and the error signal and reference signal are decreased and increased by the same amplitude respectively so as to meet the following relation:

$$2*\Delta I_{ERR}R1*T/2 = 2*\Delta I_{REF}R2*T/2 = I_{offset}*(T/2-T_{offset}) = I_{ERR}R1*T_{offset} = \text{CONT} \quad (2)$$

As long as the above equation is met, the best sampling condition can also be met when the loop is locked.

Of course, the decreased amplitude of the error signal and the increased amplitude of the reference signal can be different, what needs to be ensured is that the average value of the decreased voltage amplitude of the error signal minus the average value of the increased voltage amplitude of the reference signal is equal to the average value of that part of voltage raised by $I_{offset}$.

Figure 9:
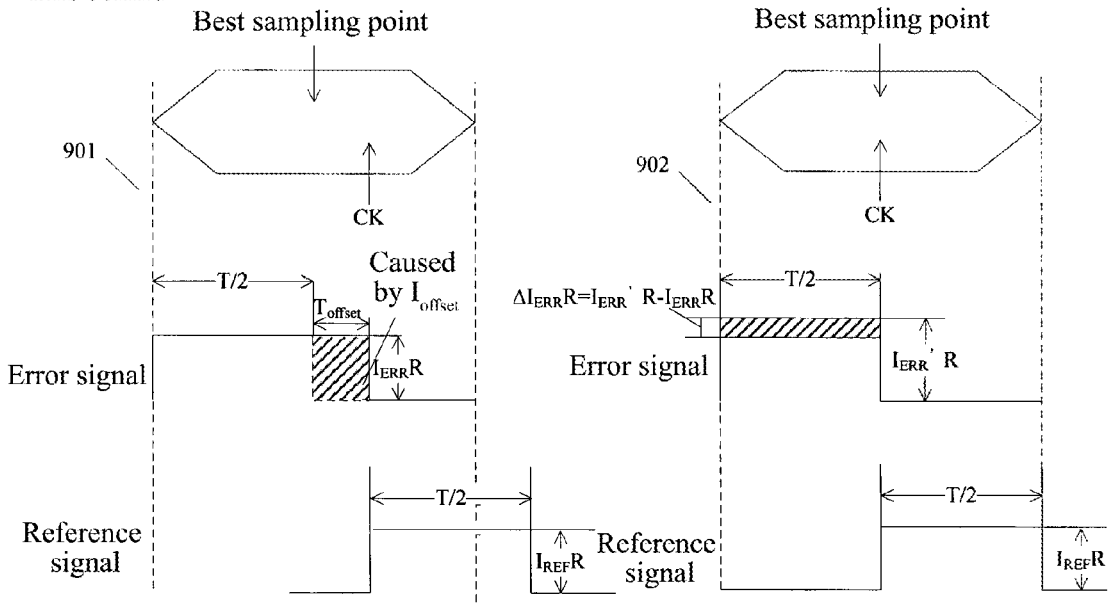
FIG. 9 is the situation where the clock falls behind the data corresponding to FIG. 7.

Another situation where there is phase difference is that the clock falls behind, as shown by 901 in FIG. 9. At this moment, the clock is behind the data by time $T_{offset}$. The offset voltage generated by the equivalent offset current source $I_{offset}$ within a period is $I_{offset}*(T/2+T_{offset})$. As shown by 902 in FIG. 9, the amplitude of the error signal can be increased while ensuring the amplitude of the reference signal not to be changed so as to meet the following relation:

$$\Delta I_{ERR}R1*T/2 = I_{offset}*(T/2+T_{offset}) = I_{ERR}R1*T_{offset} = \text{CONT} \quad (3)$$

As long as the above equation is met, the best sampling condition can be met when the loop is locked.

Similarly, the amplitude of the reference signal can also be kept unchanged and the amplitude of the error signal is decreased to adjust the second offset current by way of the following method:

$$\Delta I_{REF}R2*T/2 = I_{offset}*(T/2+T_{offset}) = I_{ERR}R1*T_{offset} = \text{CONT}$$

where the $\Delta I_{REF}$ is the difference between the second offset current after being adjusted and the second offset current before being adjusted, and R2 is the load resistance of the second offset current source circuit.

Figure 10:
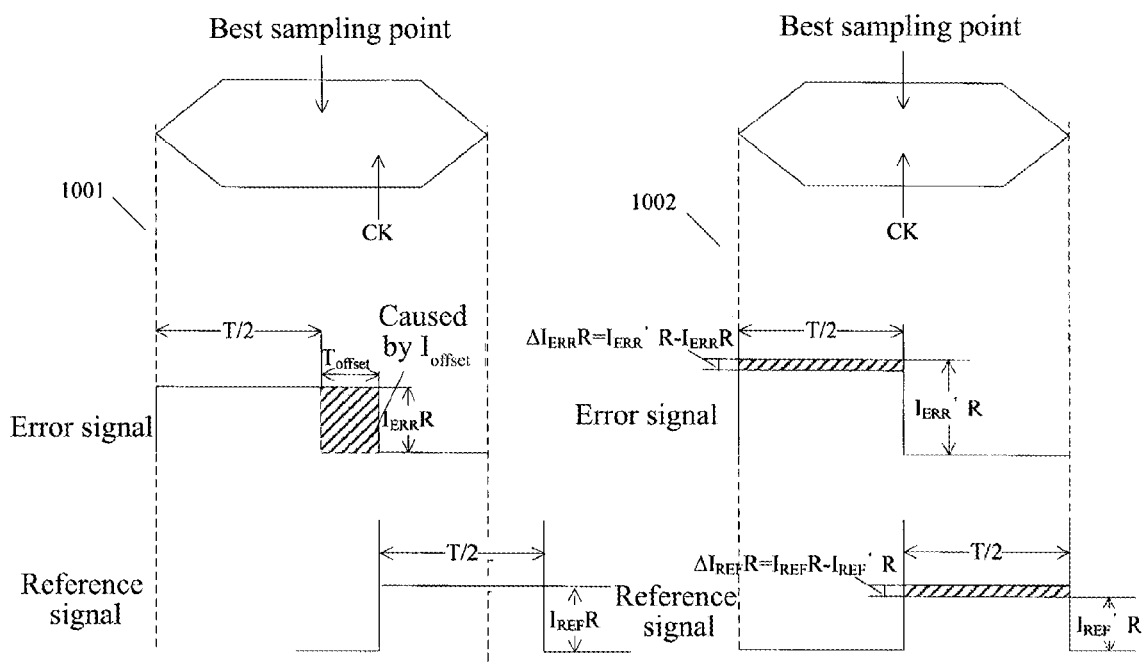
FIG. 10 is the situation where the clock falls behind the data corresponding to FIG. 8.

In addition, as shown by 1002 in FIG. 10, the error signal and reference signal are decreased and increased by the same amplitude respectively so as to meet the following relation:

$$2*\Delta I_{ERR}R1*T/2 = 2*\Delta I_{REF}R2*T/2 = I_{offset}*(T/2+T_{offset}) = I_{ERR}R1*T_{offset} = \text{CONT} \quad (4)$$

As long as the above equation is met, the best sampling condition can also be met when the loop is locked.

Of course, the increased amplitude of the error signal and the decreased amplitude of the reference signal can be different, what needs to be ensured is that the average value of the increased voltage amplitude of the error signal minus the average value of the decreased voltage amplitude of the reference signal is equal to the average value of that part of voltage raised by $I_{offset}$.

In this case, R1 can be equal or unequal to R2. In FIGS. 7, 8, 9 and 10, R1=R2=R.

In this case, the offset current source circuits in the first XOR gate and/or the second XOR gate can be implemented on the basis of the following circuit:

this offset current source circuit includes a plurality of parallel connected current sources and a plurality of switch units, with each switch unit being used for controlling the ON or OFF of a current source. A particular implementation is as shown in FIG. 11.

Figure 11:
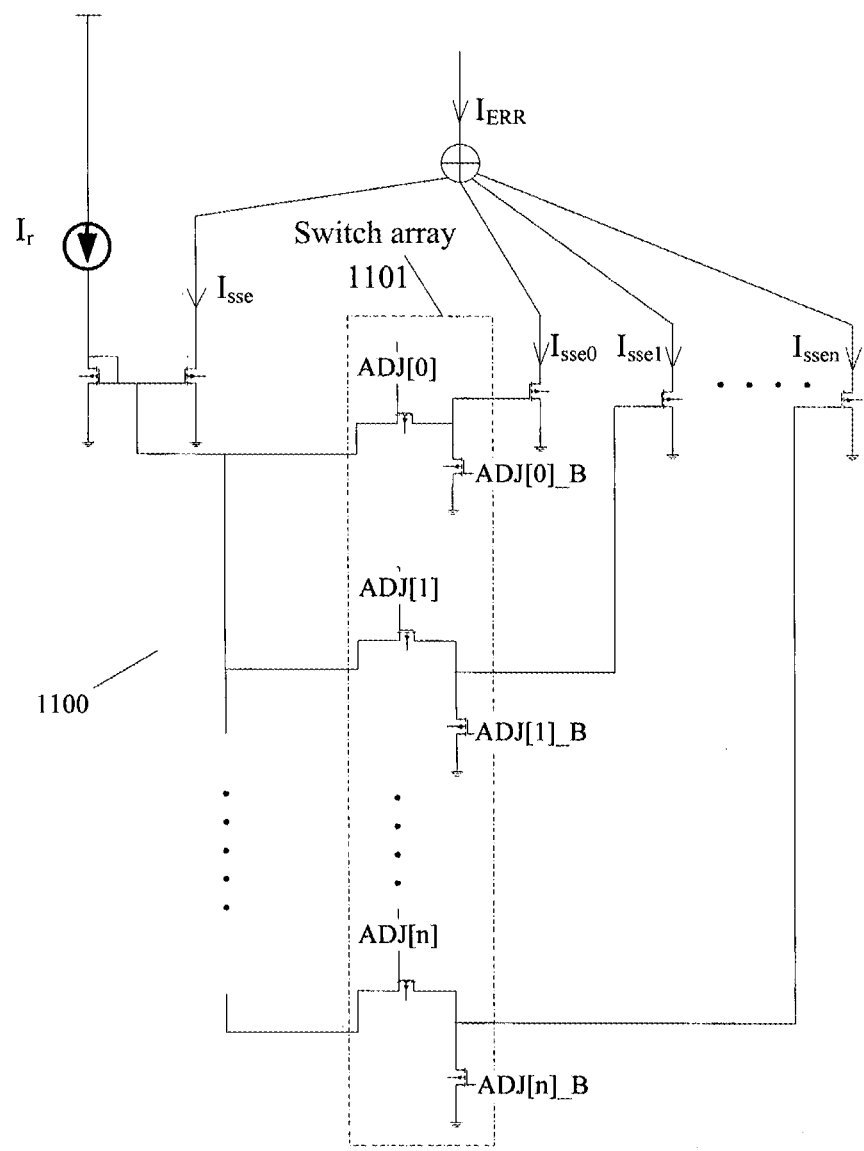
FIG. 11 is a block diagram of a discrete phase adjustment circuit based on a switch array for the above two adjustment methods proposed in the present invention.

FIG. 11 is a block diagram of a discrete phase adjustment circuit based on a switch array for the above two adjustment methods proposed in the present invention. As shown in FIG. 11, the circuit mainly consists of mirror current sources $I_r$, $I_{sse}$, $I_{sse0}$, $I_{sse1}$, ..., and $I_{ssen}$ and a switch array 1101, and the offset current source $I_{ERR}$ used for forming the XOR gate generating the error signal meets the following relation:

$$I_{ERR} = I_{sse} + \text{ADJ}[0]*I_{sse}0 + \text{ADJ}[1]*I_{sse}1 + \ldots + \text{ADJ}[n]*I_{ssen} \quad (5)$$

Thus, the size of the offset current source $I_{ERR}$ of the XOR gate generating the error signal step by step through the ON or OFF of the switch arrays from ADJ[0] to ADJ[n], so as to achieve the object of adjusting the amplitude of the error signal and then adjusting the phase of the VCO feedback clock proposed in the present invention. Of course, this method can also be used for the offset current source $I_{REF}$ of XOR gate generating the reference signal or applied to the offset current source $I_{ERR}$ of the XOR gate generating the error signal simultaneously and the offset current source $I_{REF}$ of XOR gate generating the reference signal, so as to achieve the object of phase adjustment. The higher the precision required by such structure, the more switch arrays required.

In order to further reduce the required switch arrays and achieve real best sampling, further proposed in the present invention is another implementation of the first offset current source circuit and the second offset current source circuit as follows:

the first offset current source circuit comprises: 1 discrete current source I10, N discrete current sources I11 to I1N, with I10 to I1N forming N+1 parallel connected branches of the first offset current source circuit;

the second offset current source circuit comprises: 1 discrete current source I20, N discrete current sources I21 to I2N, with I20 to I2N forming N+1 parallel connected branches of the second offset current source circuit, and coupled switch arrays K1 to KN, wherein Kj controls discrete current sources I1j and I2j and enables I2j to be OFF when I1j is ON and enables I2j to be ON when I1j is OFF; and the first offset current source circuit and the second offset current source circuit are connected to each other via a continuous phase adjustment unit, with the continuous phase adjustment unit being used for outputting two paths of variable currents controlled by a differential voltage, wherein one path thereof is used as a parallel branch of the first offset current source circuit and another being used as a parallel branch of the second offset current source circuit, the two paths of currents are equal in size and opposite in direction, and the first offset current and the second offset current are controlled to generate changes with equal size and opposite direction.

Figure 12:
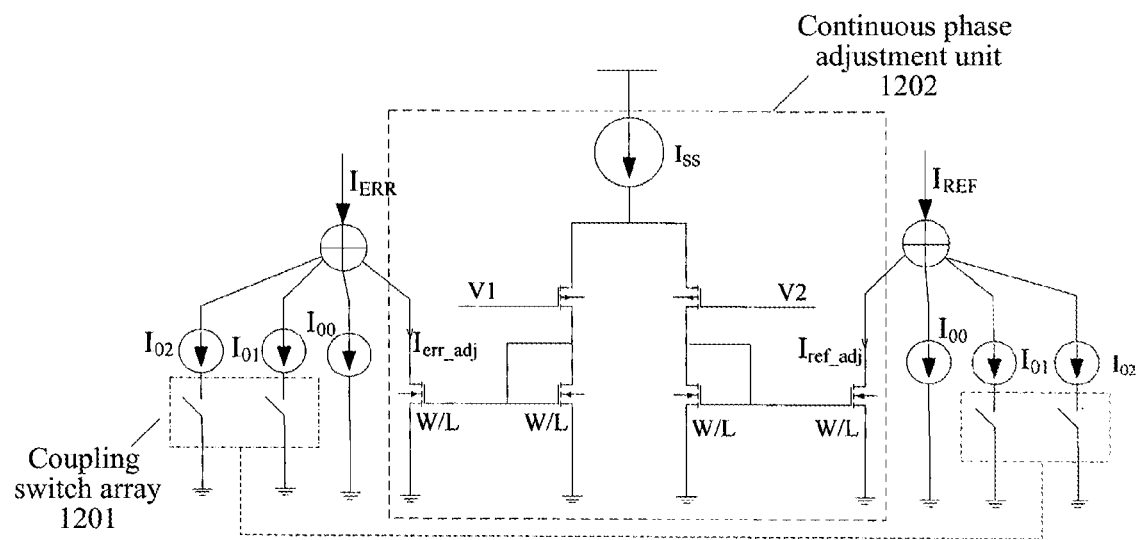
FIG. 12 is a block diagram of a circuit which can realize continuous phase adjustment proposed in the present invention.

An implementation of the above circuit is as shown in FIG. 12, and N=2 is taken as an example for description. FIG. 12 mainly includes a coupling switch array 1201 and a continuous phase adjustment unit 1202. In this case, the coupling switch array 1201 controls the discrete current sources $I_{01}$ and $I_{02}$ in the $I_{ERR}$ and $I_{REF}$, and during practical operation, the coupling switch array 1201 is required to be able to control the discrete current source $I_{01}$ in the right $I_{REF}$ to be OFF when the discrete current source $I_{01}$ in the left $I_{ERR}$ is ON, and vice versa, when the discrete current source $I_{01}$ in the left $I_{ERR}$ is OFF, the discrete current source $I_{01}$ in the right $I_{REF}$ is ON. Likewise, same requirements are placed on the discrete current source $I_{02}$ on either side. As such, it can be ensured that the second phase adjustment method proposed in the present invention can be satisfied so as to roughly adjust the phase. The continuous adjustment of the phase is achieved by the continuous phase adjustment unit 1202.

The continuous phase adjustment unit 1202 is a pull current lump current mirror. V1 and V2 differentially control the current Iss to flow through two branches, and then two mirror tubes on both sides generate two paths of differential currents on $I_{err\_adj}$ and $I_{ref\_adj}$ for outputting, so that the $I_{ERR}$ and $I_{REF}$ achieve current change with equal quantity and reverse phase and the amplitudes of the error signal and the reference signal can change in the opposite direction. Since the two following pairs of mirror tubes match each other, the following relation (6) is met, and the $I_{err\_adj}$ and $I_{ref\_adj}$ are controlled by the differential control voltages V1 and V2 and have continuous changes with equal quantity in the opposite direction, so that the above circuit can achieve the continuous adjustment of the amplitudes of the error signal and the reference signal, thus the second phase adjustment method proposed in the present invention can be ensured to be met so as to continuously adjust the phase. In this case, the differential control voltages V1 and V2 can be generated by an external circuit and can also be generated by self-adaptive method inside the chip, for example, a pair of differential control voltages can be generated by detecting and judging the bit error rate of the restored data.

$$I_{err\_adj} + I_{ref\_adh} = ISS \quad (6)$$

$$\Delta I_{ERR} = \Delta I_{REF} \quad (7)$$

The continuous phase adjustment unit shown in FIG. 12 is only an example, and other circuits which can generate two paths of currents with equal amplitude and opposite direction also fall into the scope of protection of the present invention.

Of course, the adjustable offset current source circuits shown in FIGS. 11 and 12 are only example, which are not limited by the present invention. Adjustable offset current source circuits with other structures also fall into the scope of protection of the present invention.

By way of the adjustment method shown in FIG. 12, the number of switch arrays required can be effectively reduced and real best sampling can be achieved, furthermore, it can also be made a self-adaptive best sampling, i.e. the clock and data recovery system generates a control signal by judging the bit error rate of the restored data to adjust the V1 and V2 in FIG. 12 so as to achieve best sampling and make the bit error rate of the restored data to achieve the required scope.

The present invention also provides a clock and data recovery system, comprising the phase discriminator described in the present invention.

The present invention also provides a phase adjustment method applied to the clock and data recovery system described in the present invention, comprising:

when a clock signal leads or falls behind a data signal, adjusting a first offset current of a first XOR gate and/or a second offset current of a second XOR gate.

In this case, the adjustment step includes: when the clock signal is ahead or behind the data signal by time $T_{offset}$, amplitude of the reference signal is kept unchanged, and the first offset current is adjusted by way of the following method so as to reduce or increase the amplitude of the error signal:

$$\Delta I_{ERR} R1 * T/2 = I_{ERR} R1 * T_{offset}$$

where $I_{ERR}$ is the first offset current before being adjusted, $\Delta I_{ERR}$ is the difference between the first offset current after being adjusted and the first offset current before being adjusted, the T is the period of the clock signal, and R1 is the load resistance of the first offset current source circuit;

or, the amplitude of the error signal is kept unchanged, and the second offset current is adjusted by way of the following method so as to reduce or increase the amplitude of the reference signal:

$$\Delta I_{REF} R2 * T/2 = I_{ERR} R1 * T_{offset}$$

where the $\Delta I_{REF}$ is the difference between the second offset current after being adjusted and the second offset current before being adjusted, and R2 is the load resistance of the second offset current source circuit.

In this case, the adjustment step includes: when the clock signal leads or is behind the data signal by time $T_{offset}$, the first offset current is adjusted by way of the following method so as to reduce or increase the amplitude of the error signal:

$$2 * \Delta I_{ERR} R1 * T/2 = I_{ERR} R1 * T_{offset}$$

where $I_{ERR}$ is the first offset current before being adjusted, $\Delta I_{ERR}$ is the difference between the first offset current after being adjusted and the first offset current before being adjusted, the T is the period of the clock signal, and R1 is the load resistance of the first offset current source circuit; and the second offset current is adjusted by way of the following method so as to reduce or increase the amplitude of the reference signal, and the increased or reduced amplitude of the reference signal is equal to that of the error signal:

$$2 * \Delta I_{REF} R2 * T/2 = I_{ERR} R1 * T_{offset}$$

where the $\Delta I_{REF}$ is the difference between the second offset current after being adjusted and the second offset current before being adjusted, and R2 is the load resistance of the second offset current source circuit. In this case, R1=R2. Of course, R1 may also be unequal to R2.

INDUSTRIAL APPLICABILITY

The phase adjustment method and phase discriminator proposed in the present invention can prevent introducing noise coupling into the VCO module and at the same time can realize true best sampling. In addition, the present invention can effectively reduce the number of required switch arrays so as to make the bit error rate of the restored data to reach the required scope.

What we claim is:

1. A phase discriminator, comprising: a trigger, a delay unit, a latch connected to the trigger, a first XOR gate connected to the trigger and the delay unit, a second XOR gate connected to the trigger and the latch, the phase discriminator being used for receiving a data signal and a clock signal and outputting an error signal representing phase relationship between the clock signal and the data signal and a reference signal related to flip of the data signal, wherein
the first XOR gate is a current mode logic XOR gate, the first XOR gate comprises a first offset current source circuit outputting a first adjustable offset current for controlling amplitude of the error signal output by the first XOR gate;
and/or, the second XOR gate is a current mode logic XOR gate, the second XOR gate comprises a second offset current source circuit outputting a second adjustable offset current for controlling amplitude of reference signal output by the second XOR gate.

2. The phase discriminator as claimed in claim 1, wherein the first offset current source circuit or the second offset current source circuit comprises:
a plurality of parallel connected current sources and a plurality of switch units, and each switch unit controls ON or OFF of a current source.

3. The phase discriminator as claimed in claim 2, wherein the first XOR gate is configured to control the amplitude of the error signal by way of the following method: when the clock signal is ahead or behind the data signal by time $T_{offset}$, the first offset current outputted by the first offset current source circuit is adjusted by way of the following method so as to reduce or increase the amplitude of the error signal:

$$\Delta I_{ERR} R1 * T/2 = I_{ERR} R1 * T_{offset}$$

where $I_{ERR}$ is the first offset current before being adjusted, $\Delta I_{ERR}$ is a difference between the first offset current after being adjusted and the first offset current before being adjusted, the T is a period of the clock signal, and R1 is a load resistance of the first offset current source circuit, and
the second XOR gate is configured to control the amplitude of the reference signal by way of the following method: when the clock signal is ahead or behind the data signal by time $T_{offset}$, the amplitude of the reference signal is kept unchanged, or,
the first XOR gate is configured to control the amplitude of the error signal by way of the following method: when the clock signal is ahead or behind the data signal by time $T_{offset}$, the amplitude of the error signal is kept unchanged;
the second XOR gate is configured to control the amplitude of the reference signal by way of the following method: when the clock signal is ahead or behind the data signal by time $T_{offset}$, the second offset current outputted by the second offset current source circuit is adjusted by way of the following method so as to reduce or increase the amplitude of the reference signal:

$$\Delta I_{REF} R2 * T/2 = I_{ERR} R1 * T_{offset}$$

where the $\Delta I_{REF}$ is the difference between the second offset current after being adjusted and the second offset current before being adjusted, and R2 is the load resistance of the second offset current source circuit.

4. A clock and data recovery system, comprising the phase discriminator as claimed in claim 2.

5. The phase discriminator as claimed in claim 1, wherein the first XOR gate is configured to control the amplitude of the error signal by way of the following method: when the clock signal is ahead or behind the data signal by time $T_{offset}$, the first offset current is adjusted by way of the following method so as to reduce or increase the amplitude of the error signal:

$$2 * \Delta I_{ERR} R1 * T/2 = I_{ERR} R1 * T_{offset}$$

where the $I_{ERR}$ is the first offset current before being adjusted, the $\Delta I_{ERR}$ is the difference between the first offset current after being adjusted and the first offset current before being adjusted, the T is a period of the clock signal, and the R1 is a load resistance of the first offset current source circuit,
the second XOR gate is configured to control the amplitude of the reference signal by way of the following method: when the clock signal is ahead or behind the data signal by time $T_{offset}$, the second offset current is adjusted by way of the following method so as to reduce or increase the amplitude of the reference signal, and the increased or reduced amplitude of the reference signal is equal to that of the error signal:

$$2 * \Delta I_{REF} R2 * T/2 = I_{ERR} R1 * T_{offset}$$

where the $\Delta I_{ERR}$ is the difference between the second offset current after being adjusted and the second offset current before being adjusted, and the R2 is the load resistance of the second offset current source circuit.

6. The phase discriminator as claimed in claim 5, wherein R1=R2.

7. A clock and data recovery system, comprising the phase discriminator as claimed in claim 1.

8. A phase adjustment method, applied to the clock and data recovery system as claimed in claim 7, comprising:
when a clock signal leads or falls behind a data signal, adjusting a first offset current of a first XOR gate and/or a second offset current of a second XOR gate.

9. The method as claimed in claim 8, wherein
the step of adjusting the first offset current of the first XOR gate and/or the second offset current of the second XOR gate comprises: when the clock signal is ahead or behind the data signal by time $T_{offset}$, amplitude of the reference signal is kept unchanged, and the first offset current is adjusted by way of the following method so as to reduce or increase the amplitude of the error signal:

$$\Delta I_{ERR} R1 * T/2 = I_{ERR} R1 * T_{offset}$$

where the $I_{ERR}$ is the first offset current before being adjusted, the $\Delta I_{ERR}$ is the difference between the first offset current after being adjusted and the first offset current before being adjusted, the T is the period of the clock signal, and the R1 is the load resistance of the first offset current source circuit;
or, the amplitude of the error signal is kept unchanged, and the second offset current is adjusted by way of the following method so as to reduce or increase the amplitude of the reference signal:

$$\Delta I_{REF} R2 * T/2 = I_{ERR} R1 * T_{offset}$$

where the $\Delta I_{REF}$ is the difference between the second offset current after being adjusted and the second offset current before being adjusted, and R2 is the load resistance of the second offset current source circuit.

10. The method as claimed in claim 8, wherein
the step of adjusting the first offset current of the first XOR gate and/or the second offset current of the second XOR gate comprises: when the clock signal is ahead or behind the data signal by time $T_{offset}$, the first offset current is adjusted by way of the following method so as to reduce or increase the amplitude of the error signal:

$$2*\Delta I_{ERR}R1*T/2=I_{ERR}R1*T_{offset}$$

where the $I_{ERR}$ is the first offset current before being adjusted, the $\Delta I_{ERR}$ is the difference between the first offset current after being adjusted and the first offset current before being adjusted, the T is the period of the clock signal, and the R1 is the load resistance of the first offset current source circuit; and the second offset current is adjusted by way of the following method so as to reduce or increase the amplitude of the reference signal, and the increased or reduced amplitude of the reference signal is equal to that of the error signal:

$$2*\Delta I_{REF}R2*T/2_{\square}I_{ERR}R1*T_{offset}$$

where the $\Delta I_{REF}$ is the difference between the second offset current after being adjusted and the second offset current before being adjusted, and the R2 is the load resistance of the second offset current source circuit.

11. The method as claimed in claim 10, wherein R1=R2.

12. The phase discriminator as claimed in claim 1, wherein
the first XOR gate is configured to control the amplitude of the error signal by way of the following method: when the clock signal is ahead or behind the data signal by time $T_{offset}$, the first offset current outputted by the first offset current source circuit is adjusted by way of the following method so as to reduce or increase the amplitude of the error signal:

$$\Delta I_{ERR}R1*T/2=I_{ERR}R1*T_{offset}$$

where $I_{ERR}$ is the first offset current before being adjusted, $\Delta I_{ERR}$ is a difference between the first offset current after being adjusted and the first offset current before being adjusted, the T is a period of the clock signal, and R1 is a load resistance of the first offset current source circuit, and the second XOR gate is configured to control the amplitude of the reference signal by way of the following method: when the clock signal is ahead or behind the data signal by time $T_{offset}$, the amplitude of the reference signal is kept unchanged, or, the first XOR gate is configured to control the amplitude of the error signal by way of the following method: when the clock signal is ahead or behind the data signal by time $T_{offset}$, the amplitude of the error signal is kept unchanged;

the second XOR gate is configured to control the amplitude of the reference signal by way of the following method: when the clock signal is ahead or behind the data signal by time $T_{offset}$, the second offset current outputted by the second offset current source circuit is adjusted by way of the following method so as to reduce or increase the amplitude of the reference signal:

$$\Delta I_{REF}R2*T/2=I_{ERR}R1*T_{offset}$$

where the $\Delta I_{REF}$ is the difference between the second offset current after being adjusted and the second offset current before being adjusted, and R2 is the load resistance of the second offset current source circuit.

13. The phase discriminator as claimed in claim 1, further comprising a continuous phase adjustment unit, by which the first offset current source circuit and the second offset current source circuit are connected to each other, wherein
the first offset current source circuit comprises: 1 discrete current source I10, N discrete current sources I11 to I1N, with I10 to I1N forming N+1 parallel connected branches of the first offset current source circuit;

the second offset current source circuit comprises: 1 discrete current source I20, N discrete current sources I21 to I2N, with I20 to I2N forming N+1 parallel connected branches of the second offset current source circuit, and coupled switch arrays K1 to KN, wherein Kj controls discrete current sources I1j and I2j and enables I2j to be OFF when I1j is ON and enables I2j to be ON when I1j is OFF;

the continuous phase adjustment unit is configured to: output two paths of variable currents controlled by a differential voltage, wherein one path is used as a parallel connected branch of the first offset current source circuit and another path is used as a parallel connected branch of the second offset current source circuit, with the two paths of current being equal in size and opposite in direction and controlling the first offset current and the second offset current to generate changes with equal size and opposite directions.

14. The phase discriminator as claimed in claim 13, wherein
the first XOR gate is configured to control the amplitude of the error signal by way of the following method: when the clock signal is ahead or behind the data signal by time $T_{offset}$ the first offset current is adjusted by way of the following method so as to reduce or increase the amplitude of the error signal:

$$2*\Delta I_{ERR}R1*T/2=I_{ERR}R1*T_{offset}$$

where the $I_{ERR}$ is the first offset current before being adjusted, the $\Delta I_{ERR}$ is the difference between the first offset current after being adjusted and the first offset current before being adjusted, the T is a period of the clock signal, and the R1 is a load resistance of the first offset current source circuit, the second XOR gate is configured to control the amplitude of the reference signal by way of the following method: when the clock signal is ahead or behind the data signal by time $T_{offset}$, the second offset current is adjusted by way of the following method so as to reduce or increase the amplitude of the reference signal, and the increased or reduced amplitude of the reference signal is equal to that of the error signal:

$$2*\Delta I_{REF}R2*T/2_{\square}I_{ERR}R1*T_{offset}$$

where the $\Delta I_{ERR}$ is the difference between the second offset current after being adjusted and the second offset current before being adjusted, and the R2 is the load resistance of the second offset current source circuit.

15. A clock and data recovery system, comprising the phase discriminator as claimed in claim 13.

* * * * *